US012765374B2

(12) United States Patent
Ho et al.

(10) Patent No.: US 12,765,374 B2
(45) Date of Patent: Oct. 13, 2026

(54) SEMICONDUCTOR PACKAGE WITH HEAT-DISSIPATION INTERFACE

(71) Applicant: PANJIT INTERNATIONAL INC., Kaohsiung City (TW)

(72) Inventors: Chung-Hsiung Ho, Kaohsiung City (TW); Chien-Chun Wang, Tainan City (TW); Wei-Ting Chen, Taoyuan City (TW); Wei-Ting Chen, Taipei City (TW)

(73) Assignee: PANJIT INTERNATIONAL INC., Kaohsiung City (TW)

( * ) Notice: Subject to any disclaimer, the term of this patent is extended or adjusted under 35 U.S.C. 154(b) by 333 days.

(21) Appl. No.: 18/654,215

(22) Filed: May 3, 2024

(65) Prior Publication Data

US 2025/0253202 A1 Aug. 7, 2025

(30) Foreign Application Priority Data

Feb. 7, 2024 (TW) ................................ 113104842

(51) Int. Cl.

*H10W 40/22* (2026.01)
*H10W 70/60* (2026.01)
*H10W 70/63* (2026.01)
*H10W 70/65* (2026.01)
*H10W 74/10* (2026.01)

(52) U.S. Cl.

CPC ....... *H10W 40/226* (2026.01); *H10W 70/635* (2026.01); *H10W 70/65* (2026.01); *H10W 74/111* (2026.01); *H10W 70/60* (2026.01)

(58) Field of Classification Search

None

See application file for complete search history.

(56) References Cited

U.S. PATENT DOCUMENTS

2025/0253202 A1* 8/2025 Ho ...................... H10W 40/226

* cited by examiner

*Primary Examiner* — Jack S Chen

(74) *Attorney, Agent, or Firm* — Birch, Stewart, Kolasch & Birch, LLP

(57) ABSTRACT

A semiconductor package with a heat dissipation interface has a substrate, at least one die embedded in the substrate, an insulation layer encompassing the die and covering the substrate, an upper redistribution layer (RDL) and a lower RDL respectively formed on opposite sides of the substrate, wherein an insulated adhesive comprehensively covers the lower RDL, and a dissipation layer is further bonded on the insulated adhesive. The dissipation layer evenly dissipates excessive heat energy generated by the die, thereby improving the heat dissipation efficiency.

11 Claims, 15 Drawing Sheets

SEMICONDUCTOR PACKAGE WITH HEAT-DISSIPATION INTERFACE

CROSS REFERENCE TO RELATED APPLICATIONS

This non-provisional application claims the benefit under 35 U.S.C. § 119(a) to patent application No. 113104842 filed in Taiwan on Feb. 7, 2024, which is hereby expressly incorporated by reference into the present application.

BACKGROUND OF THE INVENTION

1. Field of the Invention

The present invention relates to a semiconductor package, particularly to a semiconductor package with a heat-dissipation interface.

2. Description of the Related Art

For a discrete package, a die is embedded in dielectric encapsulant and connected to multiple leads/contacts by which the discrete semiconductor package is mounted electrically on an external circuit board. Since no heat dissipation structure would be formed on the discrete semiconductor package during the packaging processes, heat energy generated by the die only can be dissipated outside through the dielectric encapsulant as well as leads/contacts, and accordingly the heat dissipation efficiency is relatively low.

The heat dissipation efficiency may be improved by attaching an additional heat dissipation device such as a heat sink onto the surface of the discrete package. However, mounting an additional heat sink not only takes time to assemble, but also makes the overall size of the discrete package much larger, which is unfavorable for mounting onto a circuit board with limited space.

SUMMARY OF THE INVENTION

An objective of the present disclosure is to provide a semiconductor package with a heat-dissipation interface to improve heat dissipation efficiency.

The semiconductor package comprises:

- a substrate having a die mounting hole and a conductive hole;
- a die, placed in the die mounting hole, having a first surface and a second surface opposite to each other, and having at least one signal pad on each of the first surface and the second surface respectively;
- an insulation layer filling the die mounting hole and encompassing the die, covering the substrate, and exposing the at least one signal pad on the first surface of the die and the conductive hole;
- an upper redistribution layer (RDL) formed on the insulation layer and for connecting the at least one signal pad on the first surface of the die and the conductive hole, wherein the at least one signal pad on the first surface of the die is not electrically connected to the conductive hole;
- a lower redistribution layer (RDL) formed on the substrate and opposite to the upper RDL for electrically connecting the at least one signal pad on the second surface of the die to the conductive hole;
- an insulated adhesive comprehensively covering the lower RDL; and

- a dissipation layer attached to the insulated adhesive without electrically connecting to the upper RDL and the lower RDL.

The semiconductor package of the present invention can be manufactured through panel level packaging (PLP) processes to integrate a heat dissipation structure, i.e. the surface of the semiconductor package has a dissipation layer formed thereon to improve heat dissipation efficiency. The dissipation layer may also shield external noise and provide anti-electromagnetic interference effect.

A method for manufacturing the semiconductor package may comprise steps of:

- forming at least one die mounting hole and a conductive hole in a substrate;
- attaching a die in the die mounting hole, wherein the die has a first surface and a second surface opposite to each other, and having at least one signal pad on each of the first surface and the second surface respectively;
- applying an insulation layer on the substrate to fill the die mounting hole and encompass the die, wherein the at least one signal pad on the first surface of the die and the conductive hole are exposed from the insulation layer;
- forming an upper redistribution layer (RDL) and a lower redistribution layer, the upper RDL being formed on the insulation layer and connecting the at least one signal pad on the first surface of the die and the conductive hole; the lower RDL being formed on the substrate and opposite to the upper RDL and electrically connecting the at least one signal pad on the second surface of the die to the conductive hole;
- forming an insulated adhesive to comprehensively cover the lower RDL; and
- attaching a dissipation layer to the insulated adhesive without electrically connecting to the upper RDL and the lower RDL.

Other objectives, advantages and novel features of the invention will become more apparent from the following detailed description when taken in conjunction with the accompanying drawings.

DETAILED DESCRIPTION OF THE INVENTION

Figure 1A:
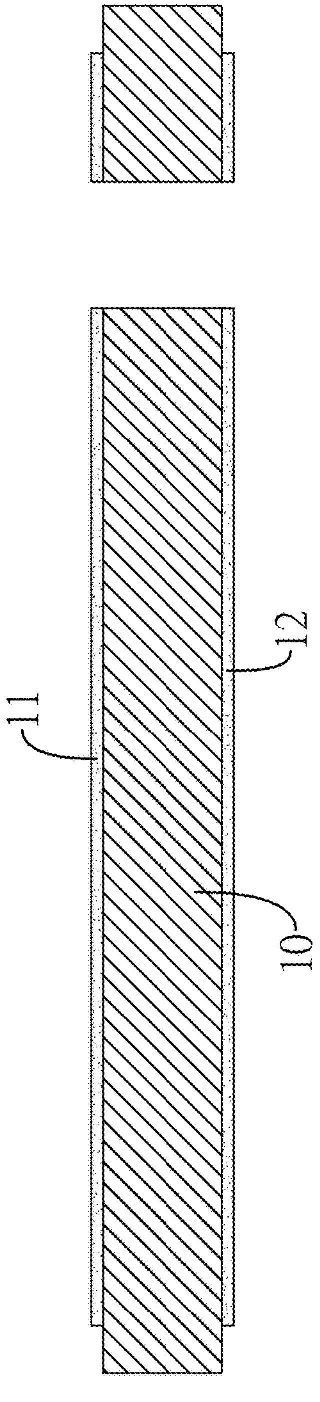
FIGS. 1A to 1M illustrate manufacturing processes of a semiconductor package in accordance with the present invention.

With reference to FIG. 1A, according to one embodiment, a copper clad laminate (CCL) is used as a substrate having an insulation body 10 and copper films as conductive layers 11, 12 are pressed onto opposite surfaces of the insulation body 10. The substrate may be programmed to form different regions for different purposes such as accommodating a die, forming conductive holes and forming a redistribution layer (RDL). In FIG. 1A, the substrate has been drilled to form a plurality of through holes, where only one through hole is illustrated.

Figure 1B:
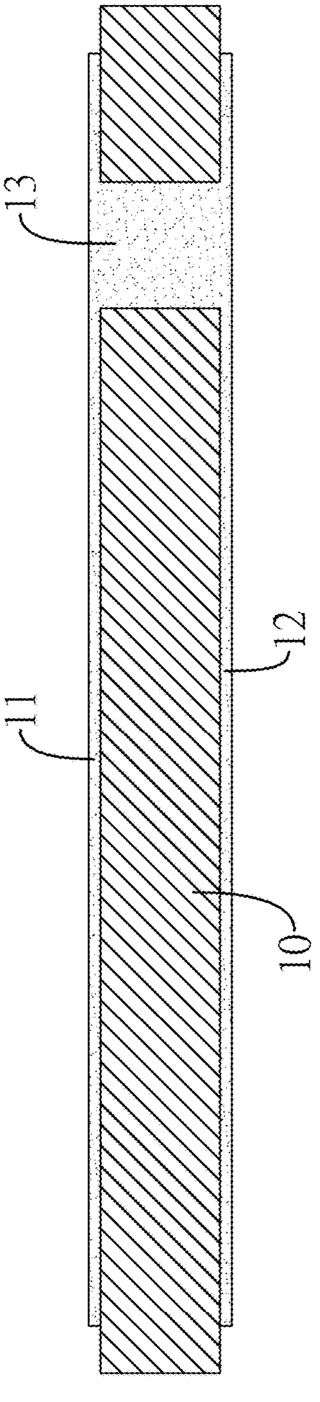
Figure 1C:
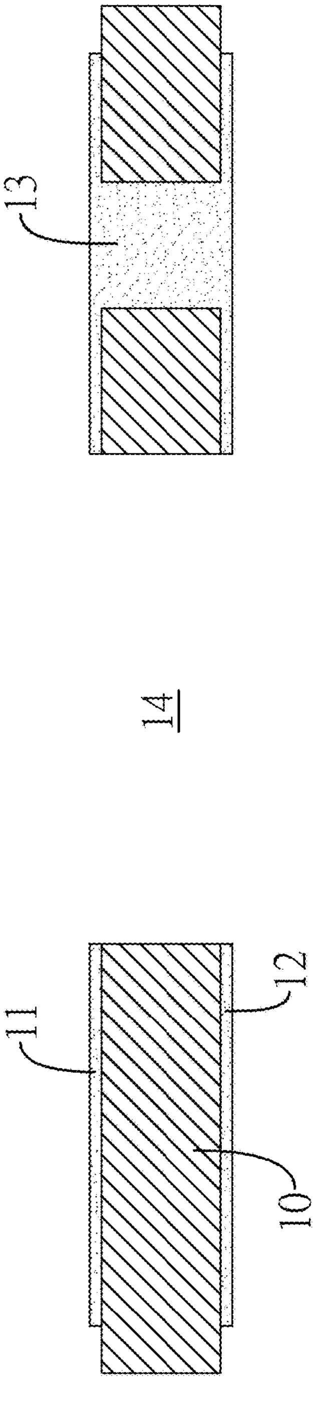

With reference to FIGS. 1B and 1C, each through hole in the substrate is electroplated to form a conductive hole 13. An inner wall of the conductive hole 13 may be electroplated or filled by conductive material such as copper so that the conductive hole 13 can be electrically interconnected between the conductive layers 11, 12. Although only one conductive hole 13 is illustrated as an example in FIG. 1B, there may be a plurality of conductive holes 13 formed in the substrate according to design of the semiconductor package. As shown in FIG. 1C, the substrate is drilled to form a die mounting hole 14.

Figure 1D:
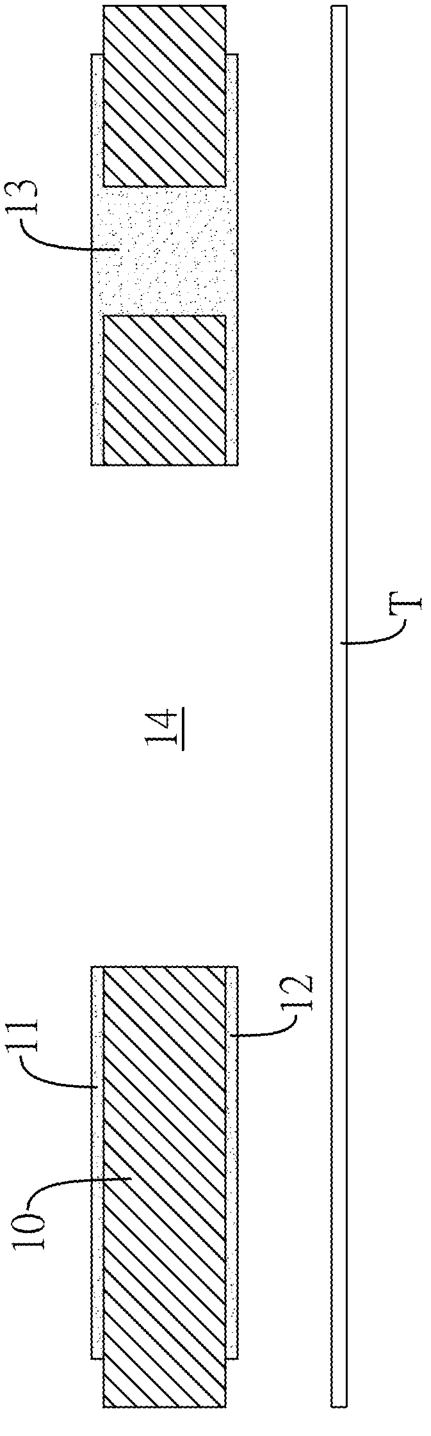
Figure 1E:
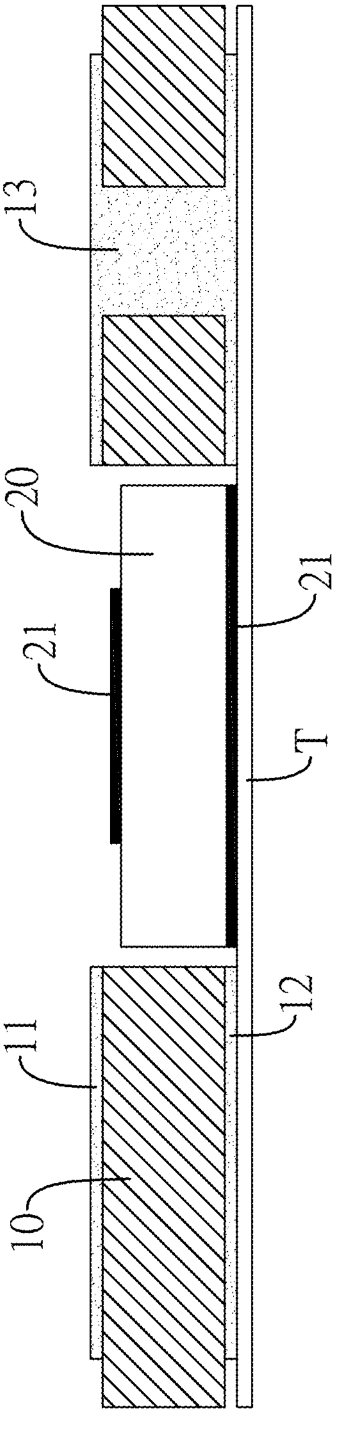

With reference to FIGS. 1D and 1E, a supporting film T having a sticky surface is temporarily attached to a back side of the substrate. When a die 20 is held in the die mounting hole 14, the die 20 can be temporarily attached to the sticky surface of the supporting film T. The die 20 has signal pads 21 which may be formed on the same surface of the die 20 or on opposite surfaces of the die 20. In the embodiment of FIG. 1E, signal pads 21 are formed respectively on the first surface and the second surface opposite to each other of the die 20.

Figure 1F:
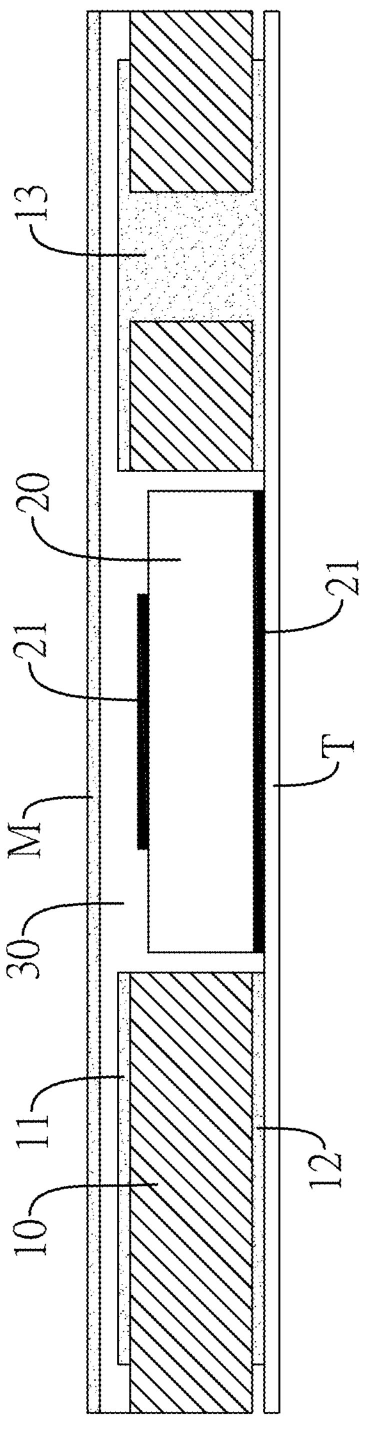

With reference to FIG. 1F, after placing the die 20 in the die mounting hole 14, an insulation layer 30 is formed on the substrate and covers the die 20. The insulation layer 30 fills the die mounting hole 14 to encompass the die 20 and covers the conductive layer 11. According to one embodiment, the insulation layer 30 may be selected from the material of Ajinomoto build-up Film®, polypropylene (PP), Taiwan build-up Film®, resin, etc. After forming the insulation film 30, a mask layer M is applied on the insulation film 30. In this embodiment, the mask layer M is a metal sputtered film.

Figure 1G:
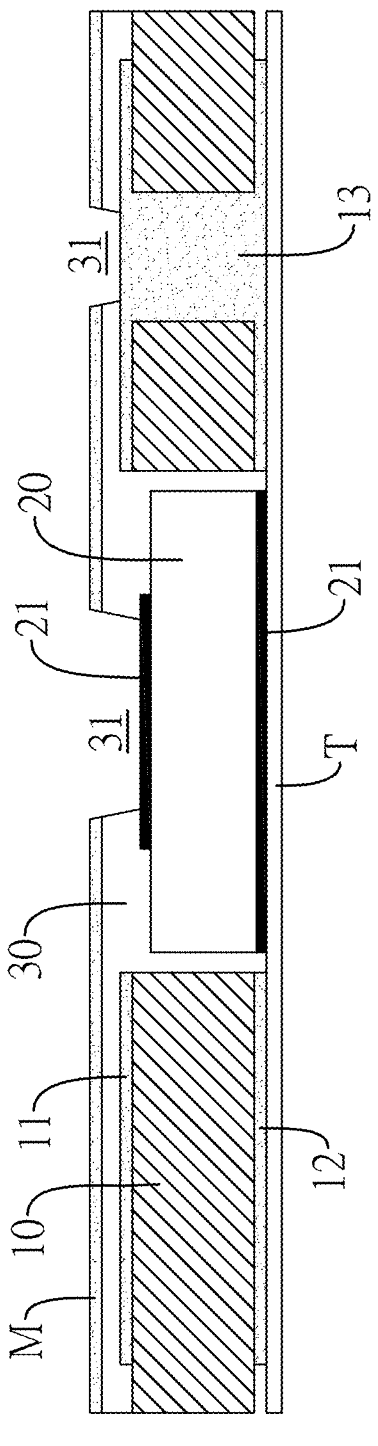

With reference to FIG. 1G, a plurality of contact openings 31 is formed on the mask layer M to expose the die 20 and the conductive hole 13. For example, a photolithography process for patterning the mask layer M can remove parts of the mask layer M above the die 20 and the conductive hole 13. Then, a laser drilling process is used to burn the insulation layer 30 on the die 20 and the conductive hole 13 to form contact openings 31 so that the die 20 and the conductive hole 13 can be exposed from the insulation layer 30.

Figure 1H:
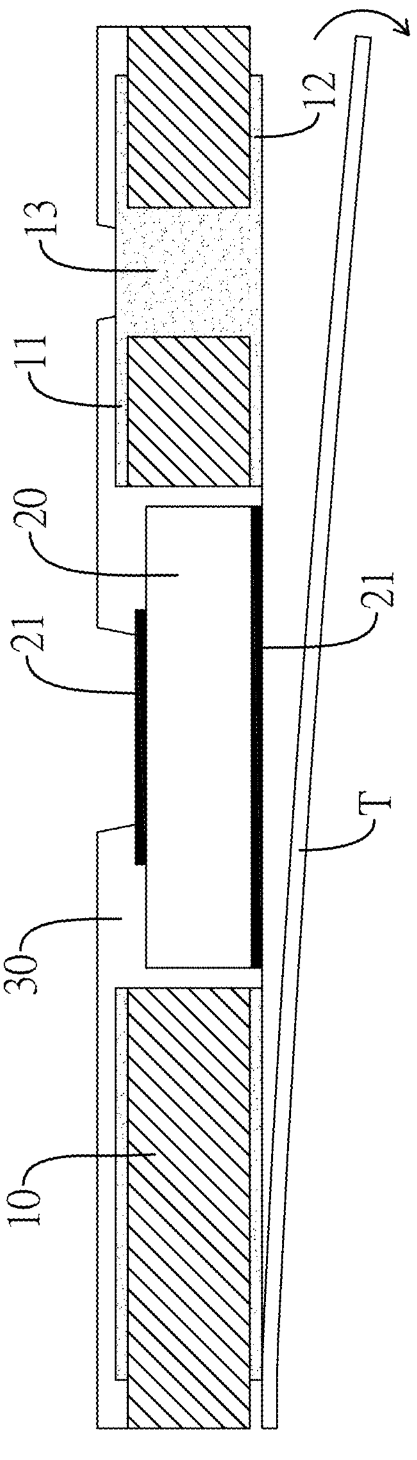

With reference to FIG. 1H, after forming the contact openings 31, the mask layer M is removed to expose the insulation layer 30. Further, the supporting film T can be peeled off from the substrate.

Figure 1I:
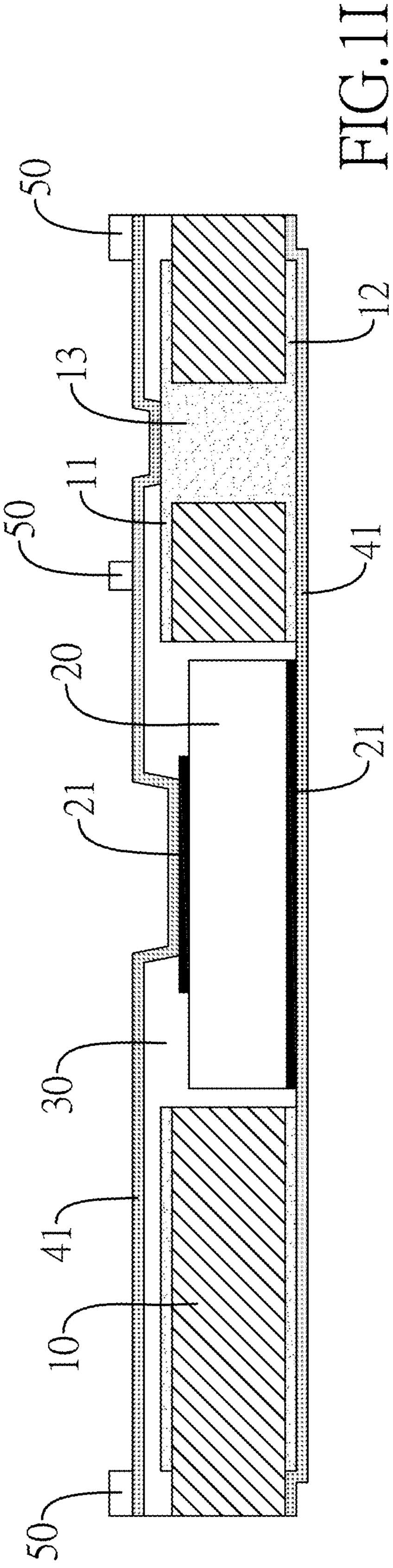

With reference to FIG. 1I, in order to have circuit layouts on opposite sides of the substrate, seed layers 41 are respectively formed on the opposite sides of the substrate. The seed layer 41 may be made by sputtering titanium/copper material and covers the opposite sides of the substrate. After forming the seed layers 41, a patterned photoresist layer 50 is provided on the seed layer 41 above the first surface of the die 20.

Figure 1J:
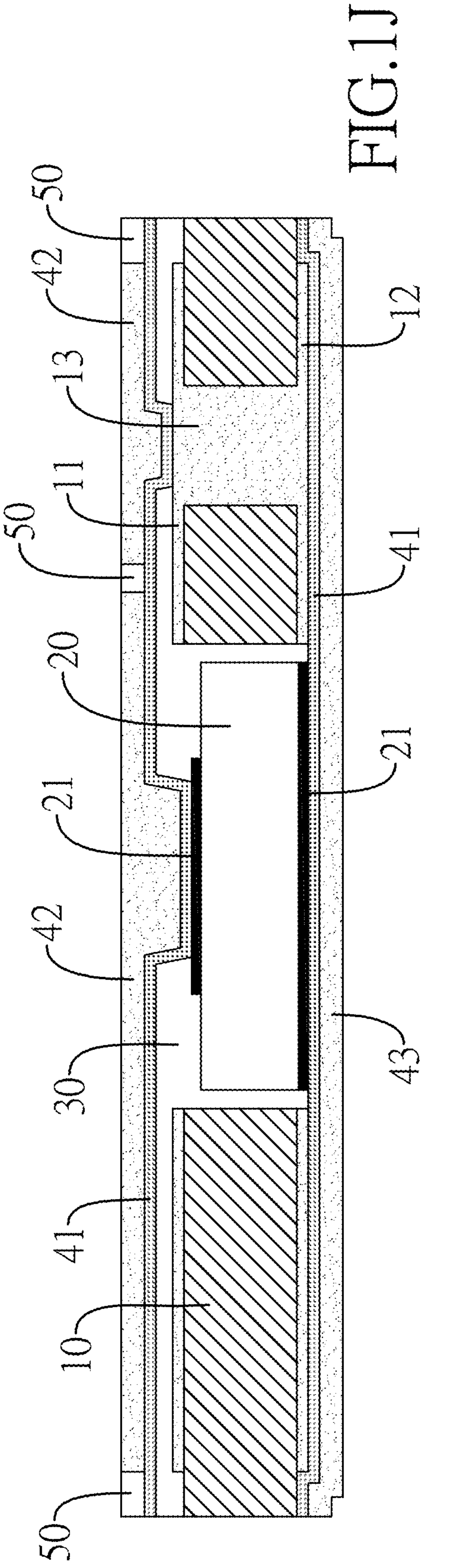

With reference to FIG. 1J, an upper redistribution layer (RDL) 42 and a lower redistribution layer (RDL) 43 are respectively formed on the seed layers 41 at opposite sides of the substrate. The upper RDL 42 and the lower RDL 43 each can be a metal layer such as a copper sputtered layer. The upper RDL 42 above the die 20 and the conductive hole 13 may be separated by a patterned photoresist layer 50 process to avoid a short circuit problem between the at least one signal pad 21 of the die 20 and the conductive hole 13. The lower RDL 43 may be patterned to electrically connect the at least one signal pad 21 at the bottom surface of the die 20 to a respective conductive hole 13.

Figure 1K:
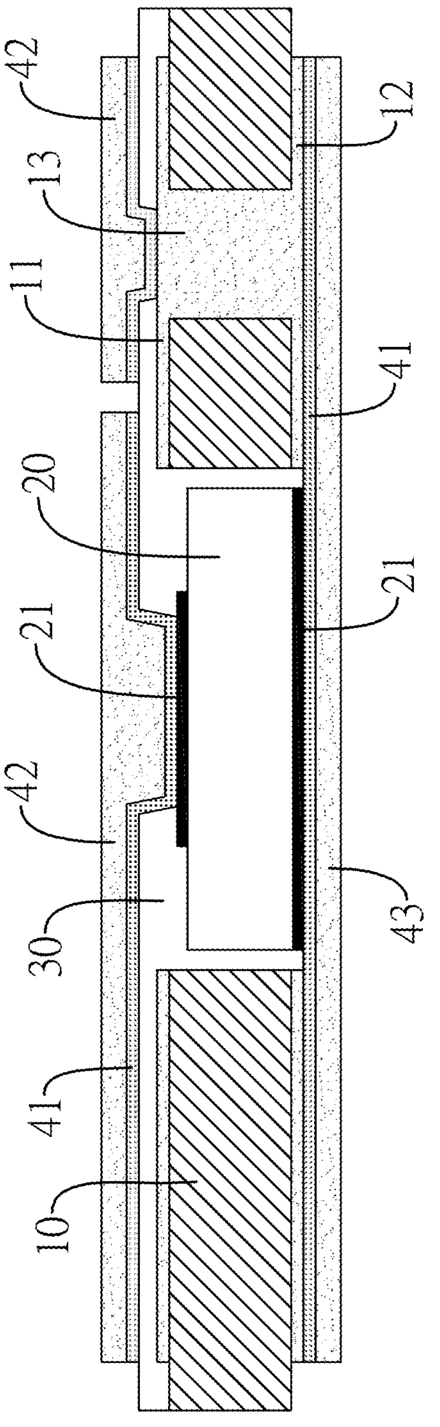

With reference to FIG. 1K, after forming the upper RDL 42 and the lower RDL 43, the photoresist layer 50 and a part of the seed layer 41 may be removed from the substrate. For example, the seed layer 41 under the photoresist layer 50 can be etched through the photolithography process. Besides, the lower RDL 43 may also be further patterned to form a layout pattern as required by the same photolithography process.

Figure 1L:
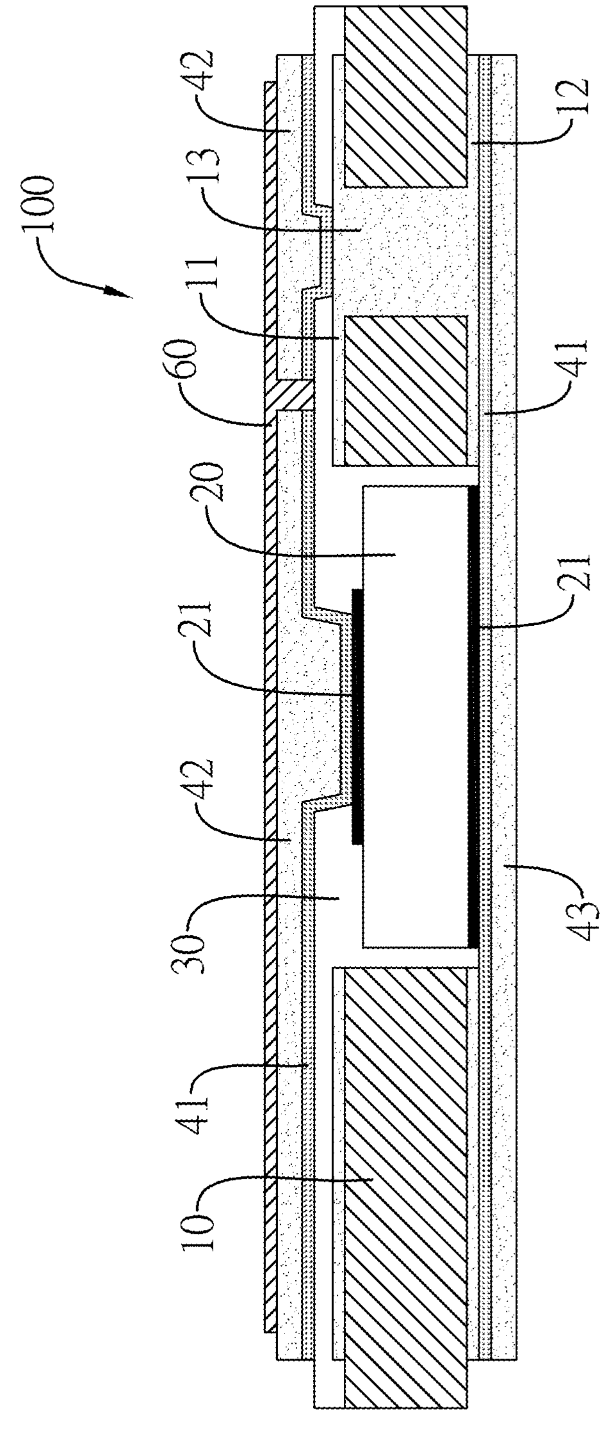

With reference to FIG. 1L, a solder mask layer 60 is then formed on the upper RDL 43. The solder mask layer 60 is made of an insulation material to protect the upper RDL 42. Parts of the upper RDL 42 as connection contacts of the semiconductor package 100 will be exposed from the solder mask layer 60. For example, the upper RDL 42 near the edges of the semiconductor package 100 are not covered by the solder mask layer 60.

Figure 1M:
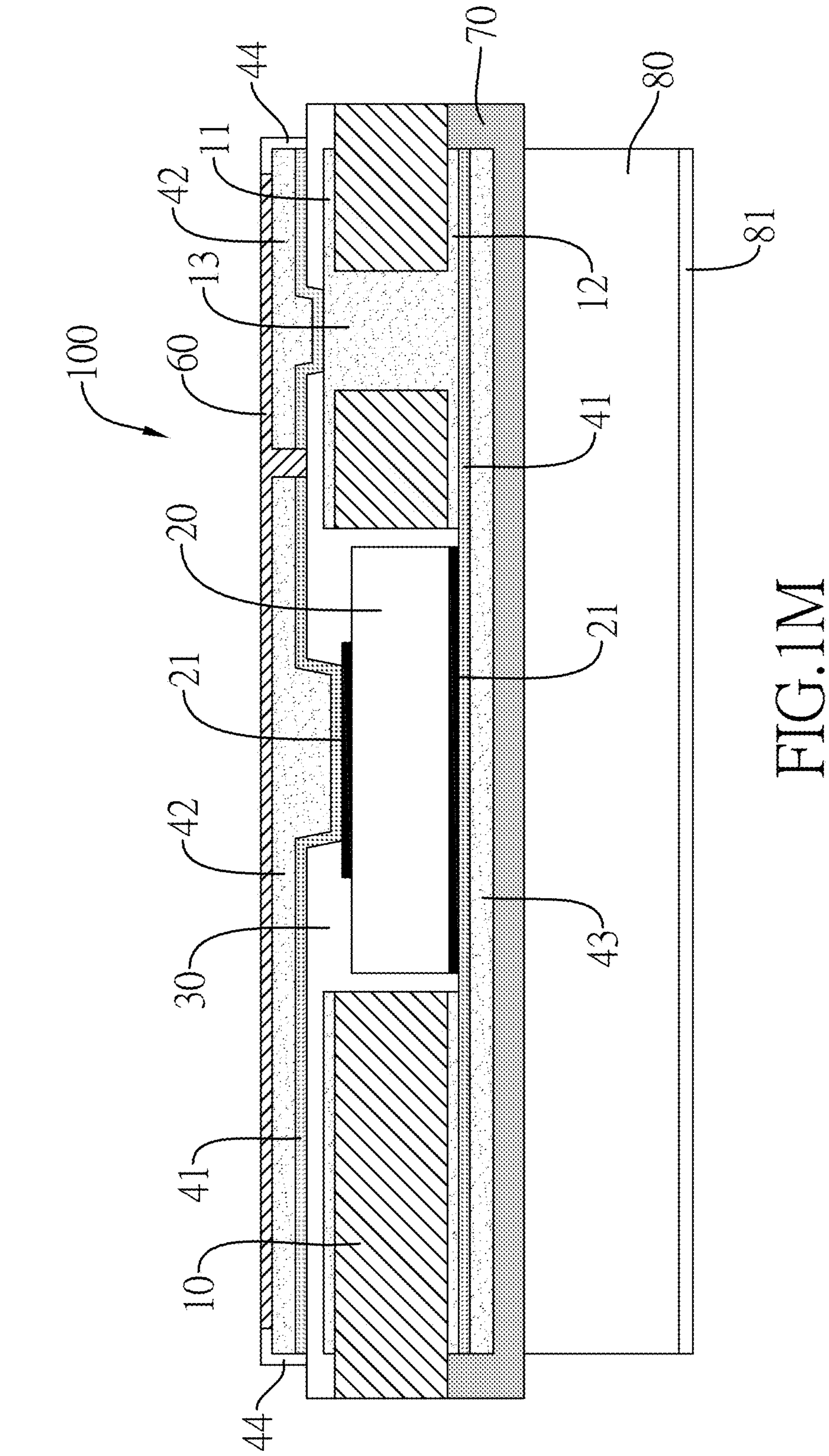

With reference to FIG. 1M, an insulated adhesive 70 is provided on the lower RDL 43. For example, an insulation film with thermal conductive property can be attached to the lower RDL 43 and then heated to form the insulated adhesive 70. The insulated adhesive 70 isolates the lower RDL 43 from a metal layer to be formed in subsequent processes to avoid short circuits. Alternatively, the insulated adhesive 70 may be in other forms such as glue type. The insulated adhesive 70 can be dispensed or pressed onto the surface of the lower RDL 43 with a proper thickness. Preferably, the insulated adhesive 70 has a thin thickness without air bubbles therein.

In the semiconductor package 100, a dissipation layer 80 is bonded on the insulated adhesive 70. The dissipation layer 80 can be made of a single material metal layer such as an aluminum layer or a copper layer, an alloy layer of different metals, or a composite layer stacked by different metals. In this embodiment, surface finishing is further performed on the dissipation layer 80, such as anodizing treatment, anti-oxidation treatment, etc., so that a protective film 81 is formed on the surface of the dissipation layer 80. If the dissipation layer 80 is made of an aluminum layer, the protective film 81 may be an alumina layer formed by anodizing process to prevent plating metal such as tin from adhering to the dissipation layer 80 in the subsequent electroplating process. If the dissipation layer 80 is the copper layer, chemical nickel plating can be performed to form a nickel film as the protective film 81 to avoid oxidization of the copper surface.

After bonding the dissipation layer 80 to the insulated adhesive 70, a singulation process is performed, i.e. separating multiple semiconductor packages 100 along their peripheries to obtain a plurality of independent semiconductor packages 100. In the singulation process, sawing blades may be used to respectively cut opposite sides of the substrate 100. After the dissipation layer 80 has been cut, the edge of the dissipation layer 80 may be slightly indented relatively to the edge of the substrate. In addition to cutting with sawing blades, the indented edge of the dissipation layer 80 may be formed by chemical ways such as a photolithography process to etch and trim the edges.

Figure 2A:
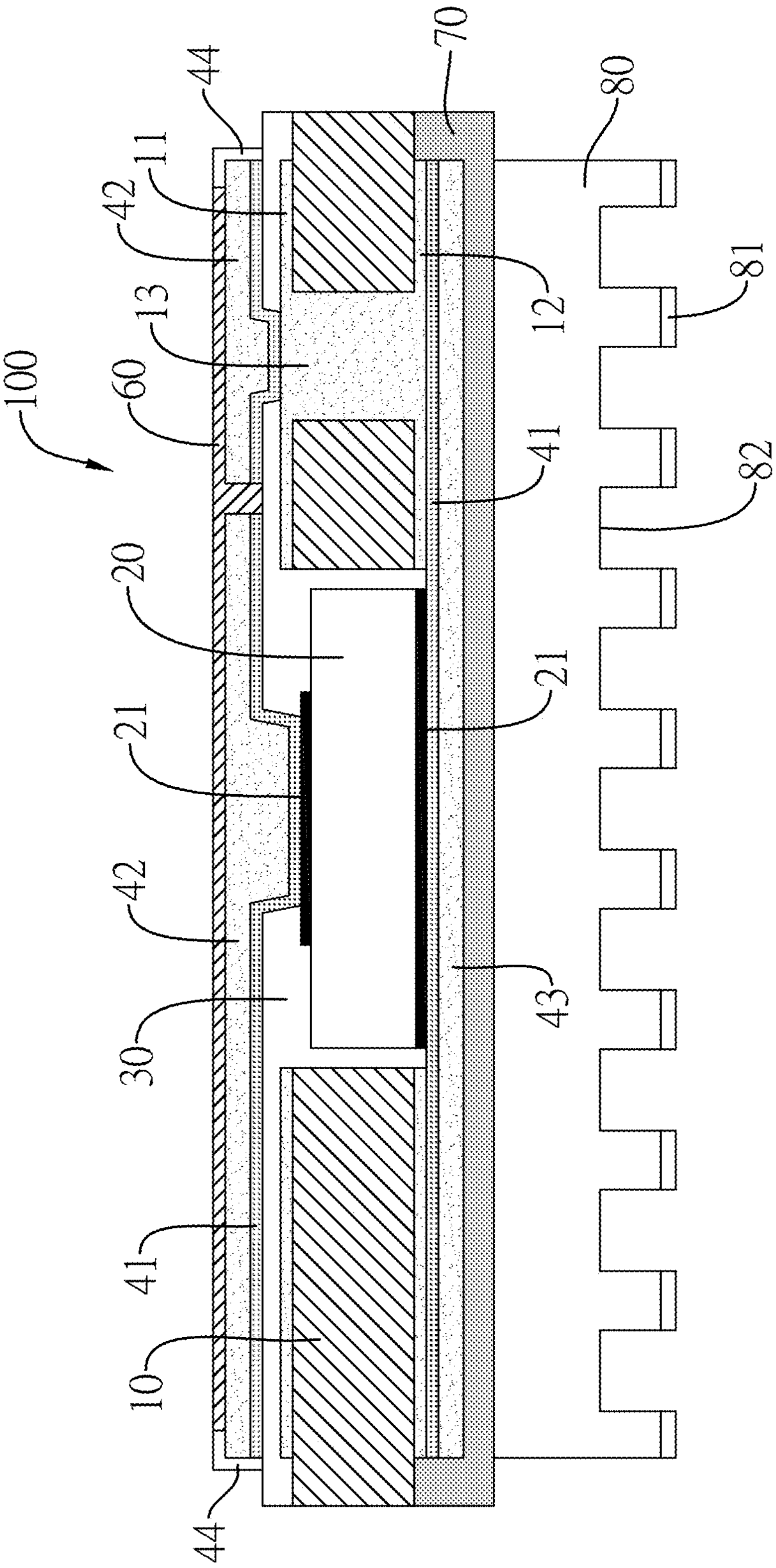
FIG. 2A shows a cross sectional view of the semiconductor package with a dissipation layer been surface finished.
Figure 2B:
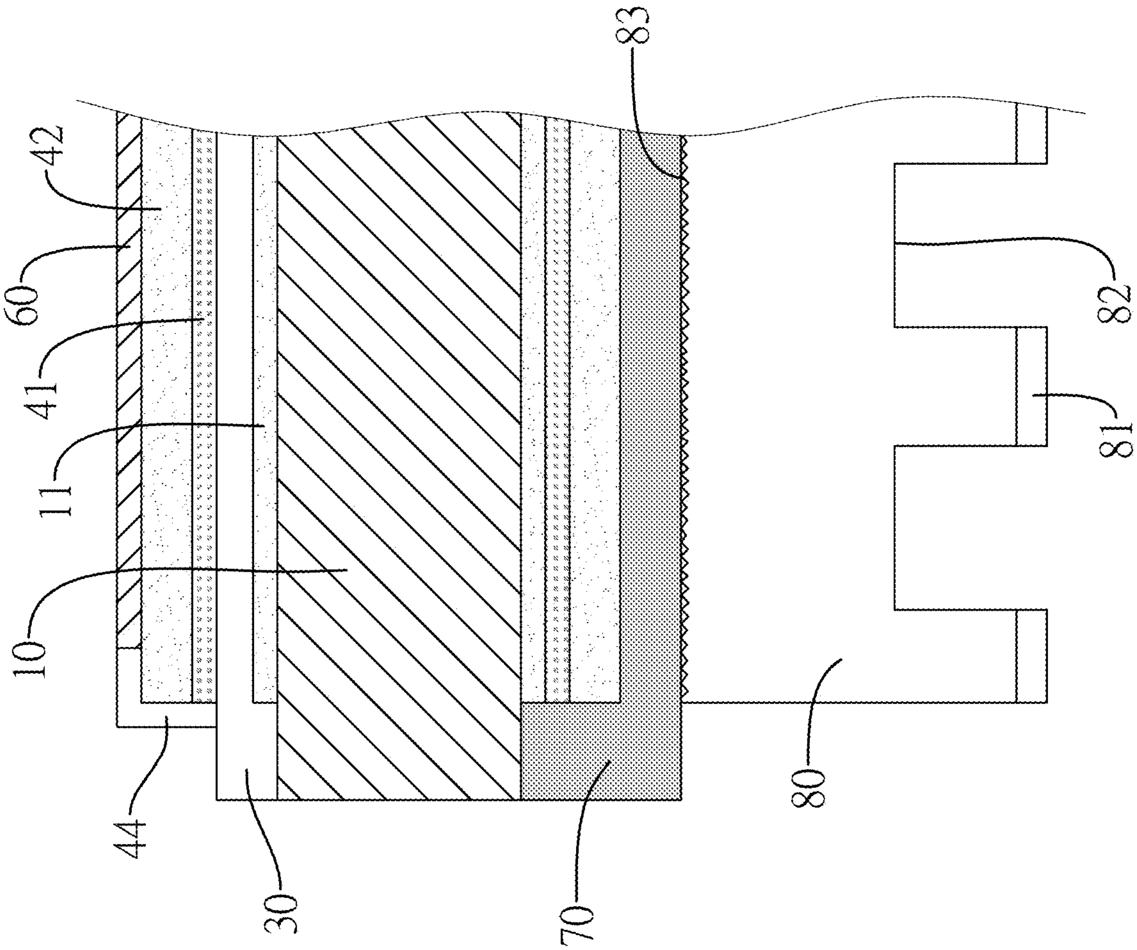
FIG. 2B shows a cross sectional view of a portion of the semiconductor package having a dissipation layer in accordance with another embodiment with surface treatment.

With reference to FIG. 2A, in order to increase heat dissipation area efficiency, the surface treatment of the dissipation layer 80 may include a surface roughening treatment or a patterning treatment. For example, performing a half-cutting, a full-cutting (cutting through the dissipation layer 80), etching, laser drilling, etc. on the dissipation layer 80 to obtain a rough and uneven surface thereof. On the rough surface of the dissipation layer 80, trenches 82 that extend into but not through the dissipation layer 80, and/or grooves formed through the dissipation layer 80 may be provided to increase heat dissipation area. In another embodiment, as shown in FIG. 2B, a bonding surface 83 of the dissipation layer 80 to be adhered to the insulated adhesive 70 may further be processed to become a roughened surface for improving adhesion strength between the dissipation layer 80 and the insulated adhesive 70.

The patterning treatment on the dissipation layer 80 means forming a pattern or identifications such as text, marks (ink marks, laser marks, etc.) on the surface of the dissipation layer 80. In another embodiment, the dissipation layer 80 may be formed as a specific pattern. The text, marks or pattern may be used for various purposes such as product model series numbers, electrical characteristics identifications (polarities, pin numbers, etc.).

The performing sequence of anodizing process, surface roughening process and surface patterning process included in the aforementioned surface finishing is not limited. Different foregoing processes may be selectively and commonly applied to the dissipation layer 80. In another embodiment, surface roughening process is first applied to the dissipation layer 80 and followed by the anodizing process. Portions of the upper RDL 42 as connecting pads of the semiconductor package 100 are exposed from the solder mask layer 60 and electroplated to form a soldering layer such as tin layer.

Figure 3:
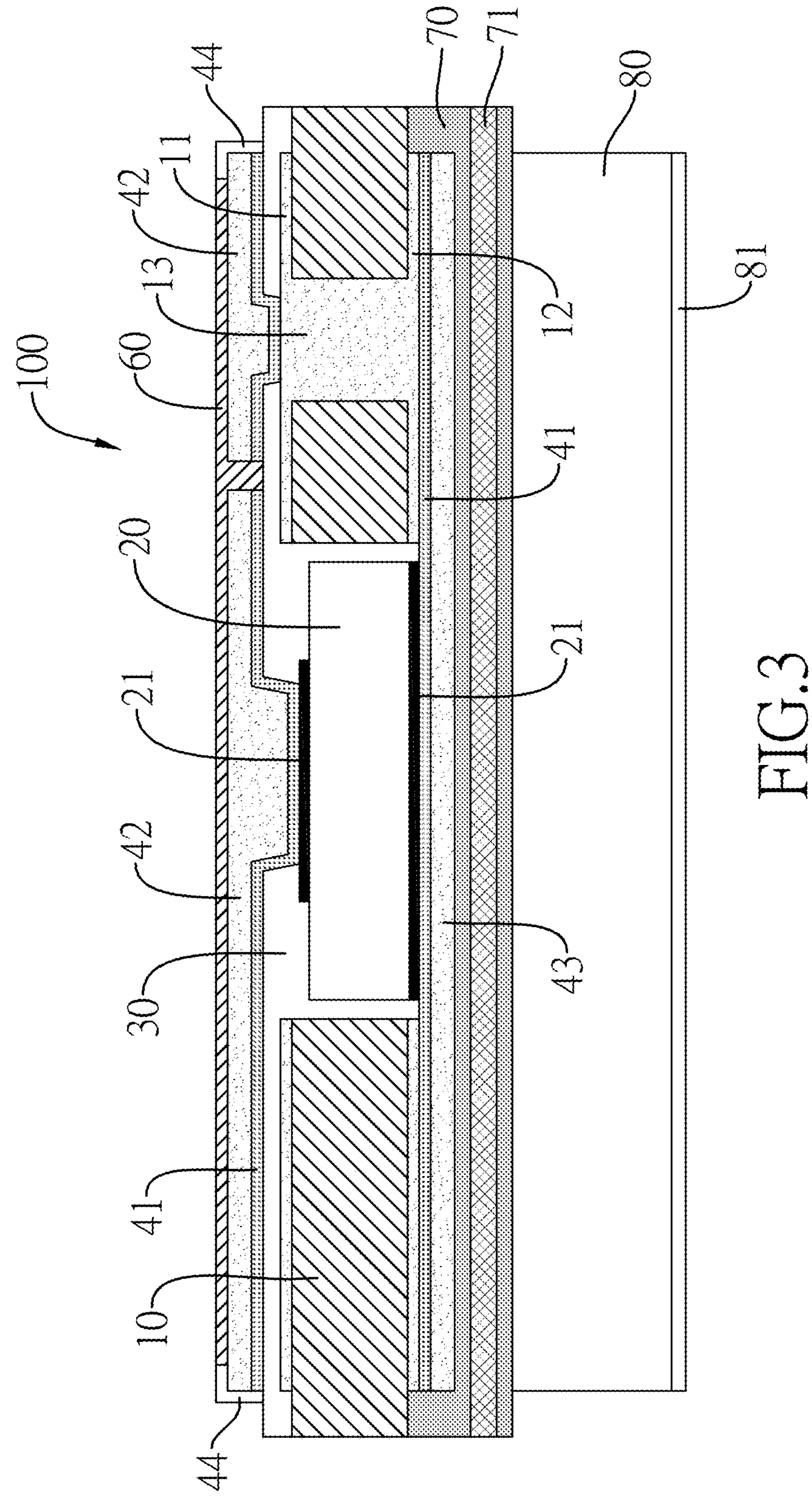
FIG. 3 shows a cross sectional view of a semiconductor package having an insulation heat dissipation layer with a supporting layer included therein.

With reference to FIG. 3, in another embodiment, the insulated adhesive 70 further includes a supporting layer 71 manufactured by insulative fibers like glass fibers to enhance insulation effect. With the supporting layer 71, a total thickness of the insulated adhesive 70 is increased to enhance the insulation effect and avoid the short circuit between the lower RDL 43 and the dissipation layer 80.

Figure 4A:
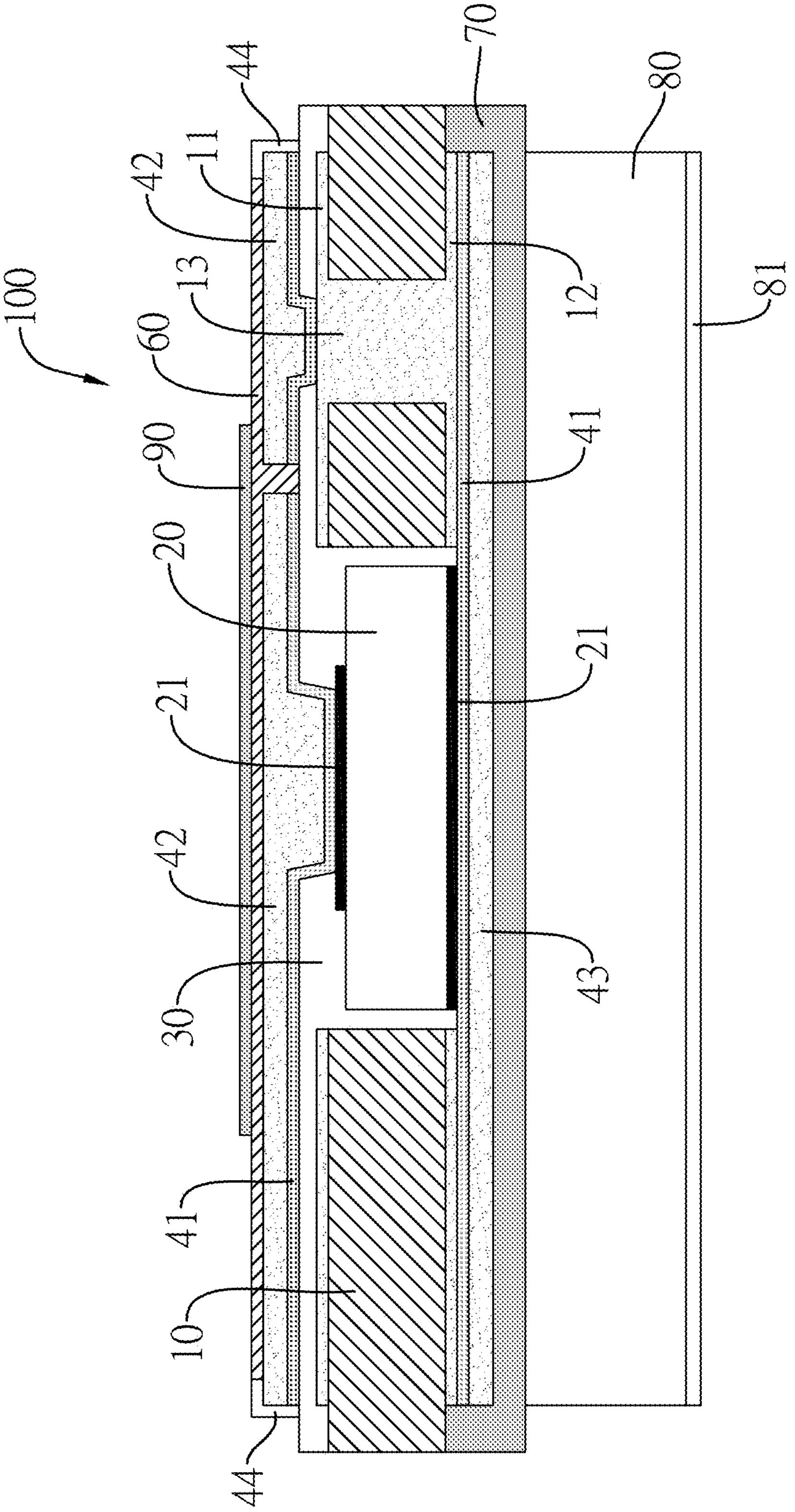
FIGS. 4A and 4B respectively show a semiconductor package with a heat dissipation plate of the present invention.
Figure 4B:
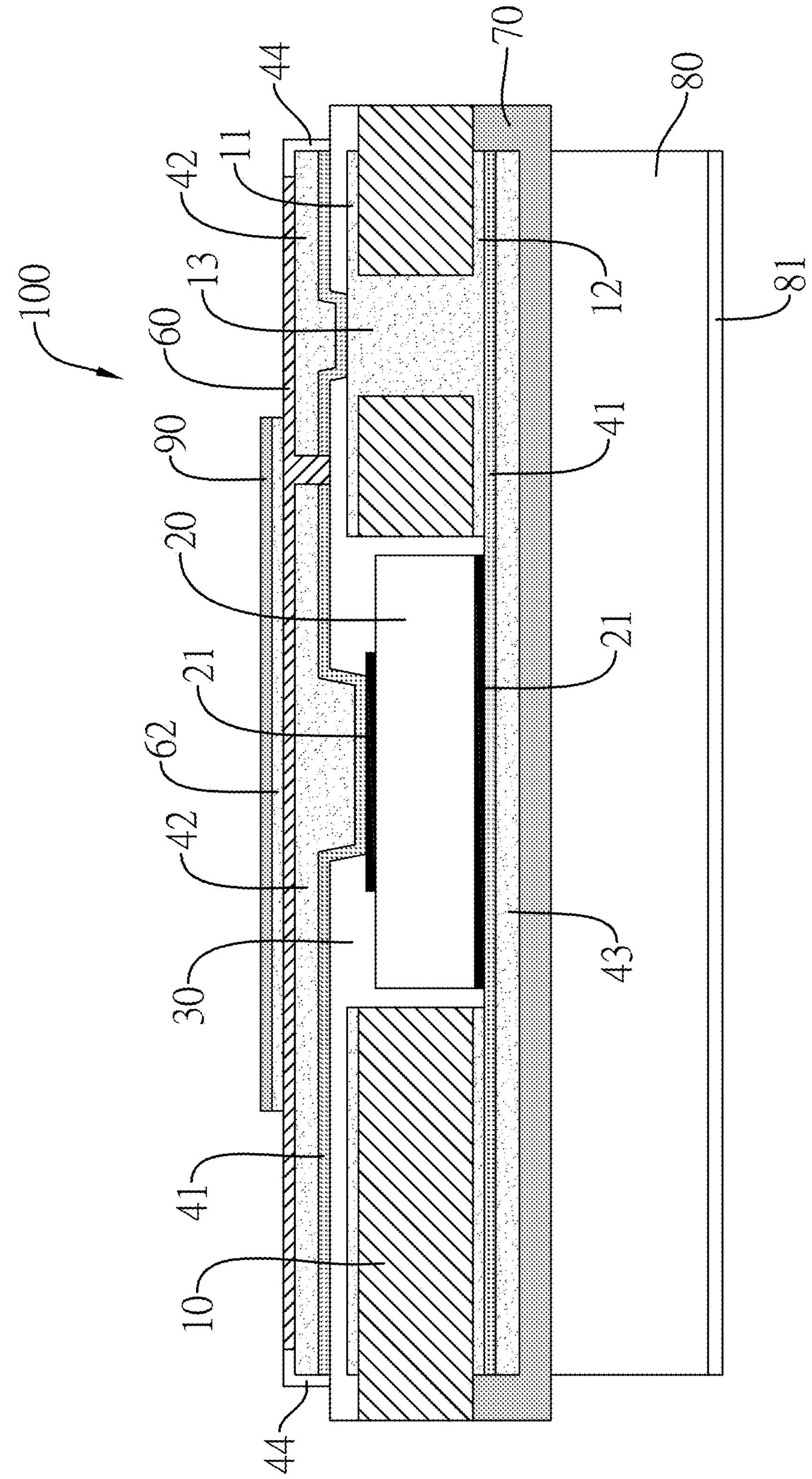

With reference to FIG. 4A, a heat dissipation plate 90 may be further attached to the semiconductor package 100 opposite to the dissipation layer 80 to increase more heat dissipation area. In this embodiment, the heat dissipation plate 90 is a metal plate made by copper, aluminum, silver, etc. partially or comprehensively covering the solder mask layer 60. With reference to FIG. 4B, in another embodiment, a heat conductive medium layer 62 is further inserted between the heat dissipation plate 90 and the solder mask layer 60. The surface of the solder mask layer 60 may be processed to form a rough surface, thereby enhancing the adhesion strength between the solder mask layer 60 and the heat dissipation plate 90.

Figure 5A:
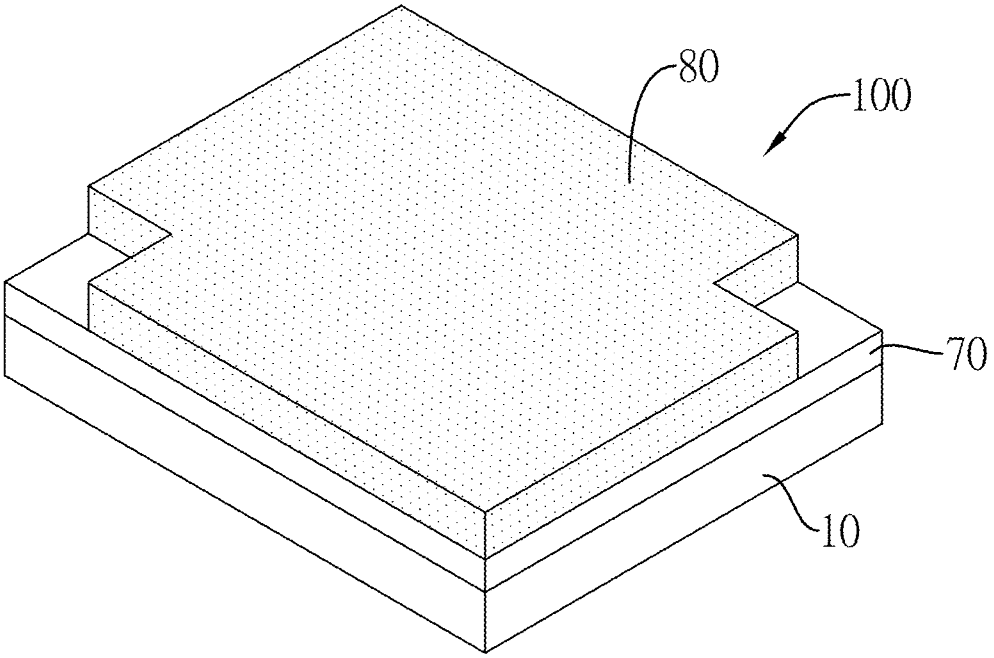
FIGS. 5A to 5C show different semiconductor packages each being not comprehensively covered by a dissipation layer.
Figure 5B:
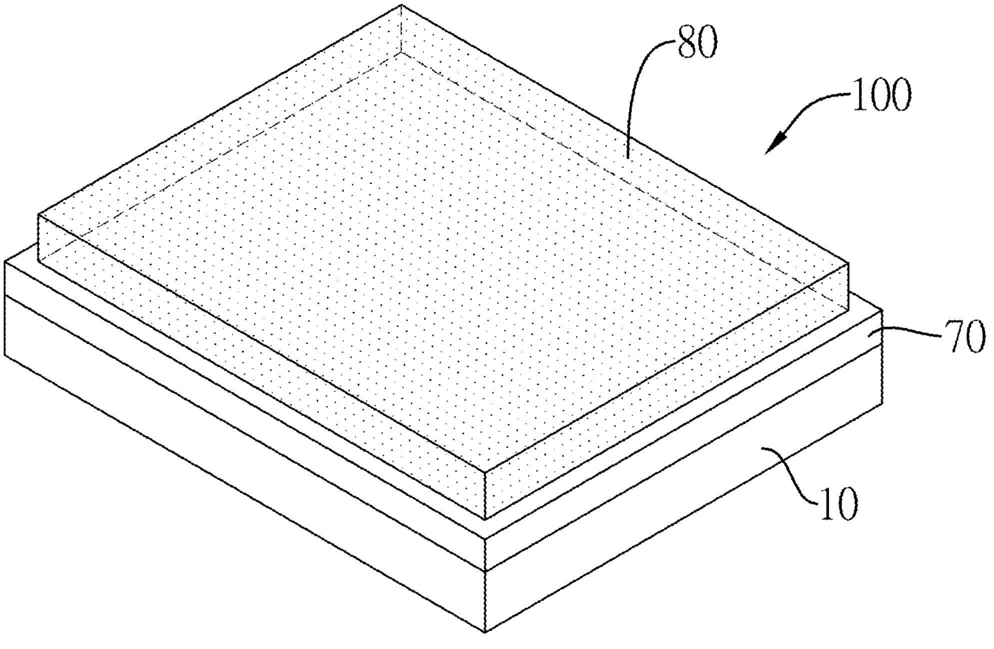
Figure 5C:
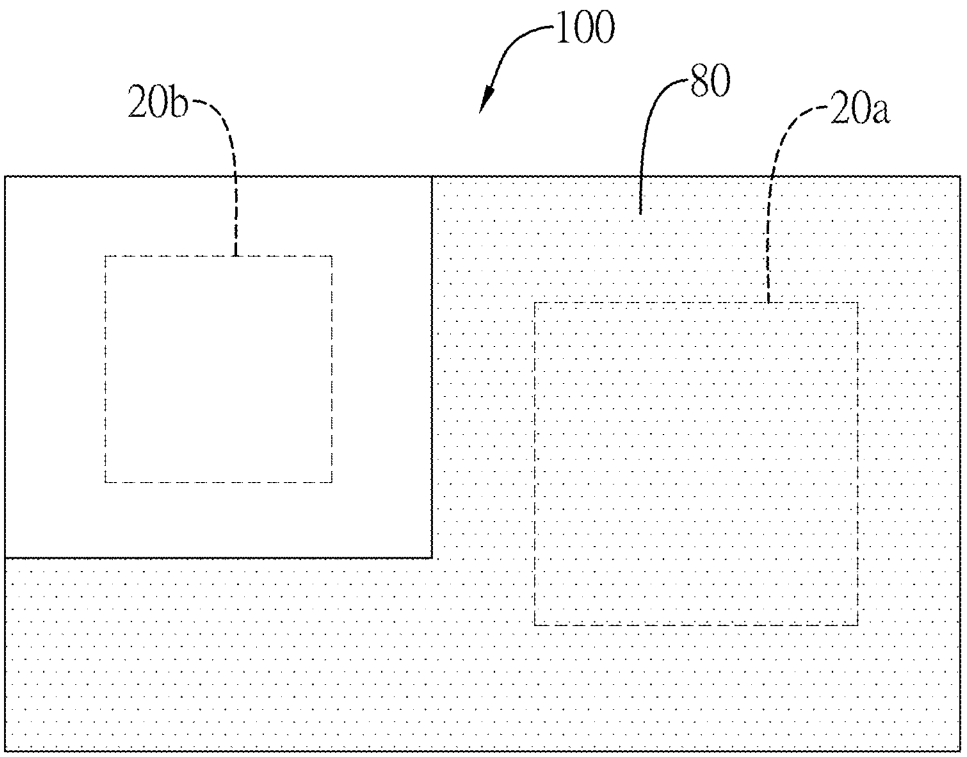

With reference to FIGS. 5A to 5C, in other embodiments, the dissipation layer 80 does not fully cover the insulated adhesive 70. For example, the dissipation layer 80 does not cover the insulated adhesive 70 distributed at corners of the semiconductor package 100 or near periphery of the semiconductor package 100. The range covered by the dissipation layer 80 may be adjusted by demands.

As shown in FIG. 5C, multiple dies may be embedded in the semiconductor package 100, including a first die 20*a* such as a MOS chip that generates relatively more heat energy and a second die 20*b* such as a passive element die or an integrated circuit die that generates less heat energy. The dissipation layer 80 is formed in a place corresponding to the first die 20*a* for dissipating heat generated. However, the dissipation layer 80 does not extend to the place where the second die 20*b* is located, thereby preventing excessive heat energy from conducting to and interfering with the second die 20*b*. For a multi-die package, the dissipation layer 80 may separately cover different regions, and/or be formed with different thicknesses in these different regions and stacked with different materials.

Figure 6:
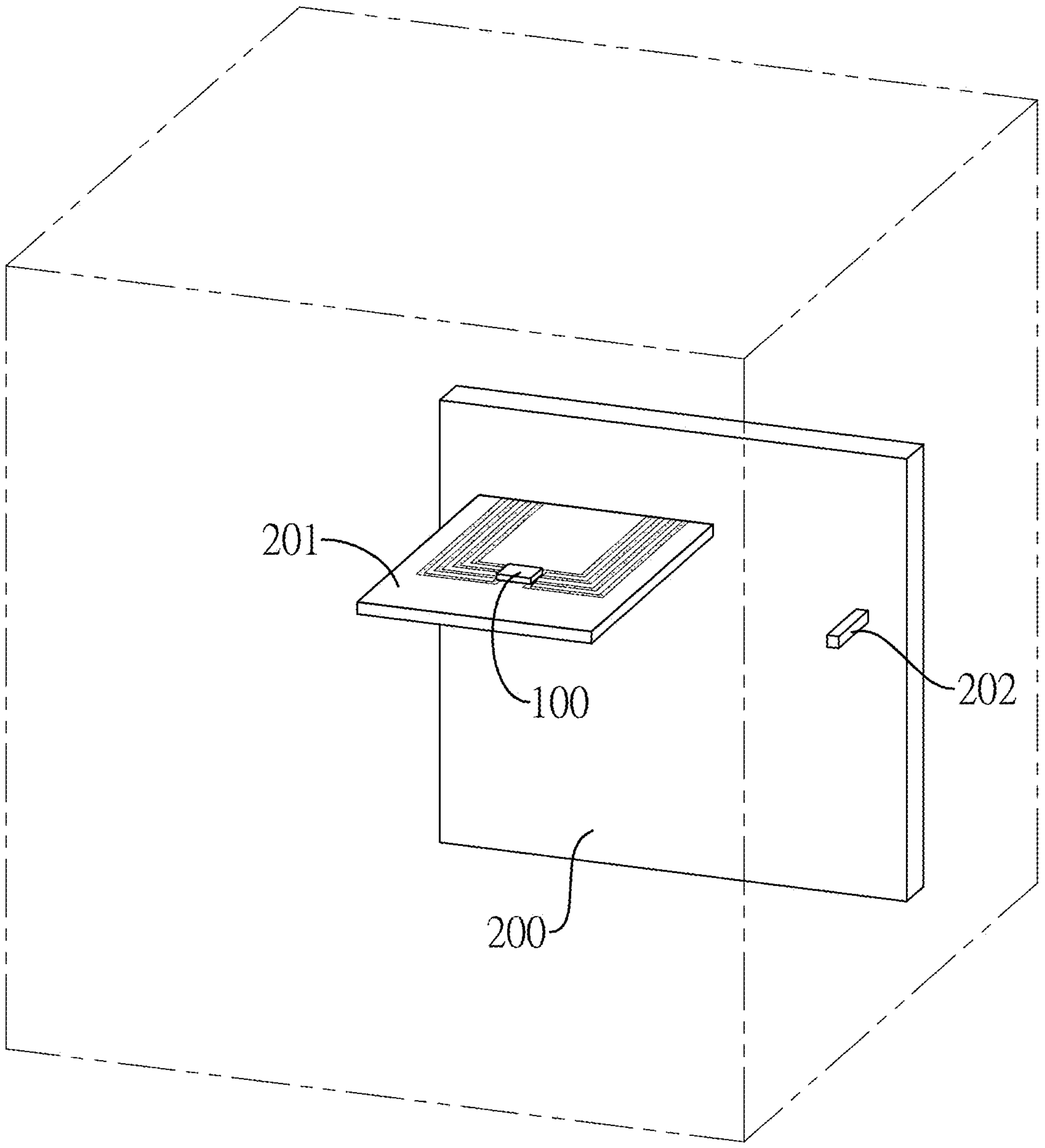
FIG. 6 shows a schematic view of a closed space used to measure the thermal impedance of the semiconductor package.

The following table lists a semiconductor package (no. 1) in accordance with prior art and a plurality of semiconductor packages 100 in accordance with different embodiments of the present invention (no. 2 to 6) to be tested in a closed space shown in FIG. 6. Each of the packages is individually tested to measure its heat dissipation performance and temperature data. For these packages 100 (no. 2 to 6) of the present invention, the insulated adhesive 70 has the same material and thickness. All the packages of different structures to be tested are sequentially numbered 1 to 6.

| Package no. | dissipation layer 80/ thickness | insulated adhesive 70 | |
|---|---|---|---|
| 1 | None | None | conventional package |
| 2 | None | Yes | |
| 3 | Aluminum/100 μm | Yes | |
| 4 | aluminum/1 mm | Yes | |
| 5 | copper/100 μm | Yes | |
| 6 | copper/1 mm | Yes | |

In the closed space, a measurement board 200 is provided and electrically connected to a test circuit board 201, wherein a semiconductor package 100 to be tested has been electrically mounted on the test circuit board 201. The measurement board 200 uses a temperature sensor 202 to sense an ambient temperature Ta (° C.). When the semiconductor package 100 operates and generates heat energy based on a test signal output from the measurement board 200, the semiconductor package 100 with four dies 20 embedded therein is measured to obtain its temperature Tj (° C.). The measured temperature data of all the semiconductor packages 100 (no. 1 to 6) are shown in the following table. The thermal impedance of each semiconductor package 100 is calculated and expressed by Rja. Taking the thermal impedance of the conventional semiconductor package (no. 1) as a reference impedance, the thermal impedance of each of the rest of the packages 100 will be compared with the reference impedance to calculate an improvement ratio. It is noted that packages of no. 4 and no. 6 under test which include the insulated adhesive 70 and the heat dissipation metal film 80 of 1 mm have better improvement ratios than others.

| Package no. | Power(w)/Die | Tj(° C.) | Ta(° C.) | Rja(° C./w) | Improvement ratio of Rja |
|---|---|---|---|---|---|
| 1 | 0.865 | 174.37 | 25.90 | 171.64 | 0% |
| 2 | 0.870 | 174.25 | 25.90 | 170.51 | 0.6% |
| 3 | 0.885 | 174.38 | 24.43 | 169.43 | 1% |
| 4 | 0.925 | 174.54 | 25.43 | 161.20 | 6% |
| 5 | 0.888 | 174.20 | 24.43 | 168.67 | 1% |
| 6 | 0.925 | 174.20 | 25.44 | 160.84 | 6% |

In the present invention, heat dissipation structure is integrated to the semiconductor package through the panel level packaging (PLP) processes. The surface of the semiconductor package has a dissipation layer formed thereon. Even there is no additional heat sink mounted on the semiconductor package, the heat dissipation efficiency is still improved. Furthermore, the dissipation layer may also shield external noise and provide anti-electromagnetic interference effect.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A semiconductor package with a heat dissipation interface comprising:

a substrate having a die mounting hole and a conductive hole;

a die, placed in the die mounting hole, having a first surface and a second surface opposite to each other, and having at least one signal pad on each of the first surface and the second surface respectively;

an insulation layer filling the die mounting hole and encompassing the die, covering the substrate and exposing the at least one signal pad on the first surface of the die and the conductive hole;

an upper redistribution layer (RDL) formed on the insulation layer and for connecting the at least one signal pad on the first surface of the die and the conductive hole, wherein the at least one signal pad on the first surface of the die is not electrically connected to the conductive hole;

a lower redistribution layer (RDL) formed on the substrate and opposite to the upper RDL for electrically connecting the at least one signal pad on the second surface of the die to the conductive hole;

an insulated adhesive comprehensively covering the lower RDL; and a dissipation layer attached to the insulated adhesive without electrically connecting to the upper RDL and the lower RDL.

2. The semiconductor package as claimed in claim 1, wherein a surface of the dissipation layer is processed by surface treatment to form a rough surface or a patterned surface.

3. The semiconductor package as claimed in claim 2, wherein a periphery of the dissipation layer is indented relatively to a periphery of the substrate; and a protective film is formed on the surface of the dissipation layer.

4. The semiconductor package as claimed in claim 2, wherein a solder mask layer is formed on the upper RDL, and parts of the upper RDL exposed from the solder mask layer function as connecting pads of the semiconductor package; and a metal heat dissipation plate is attached to the solder mask layer.

5. The semiconductor package as claimed in claim 2, wherein the insulated adhesive further comprises a supporting layer made of insulative fibers.

6. The semiconductor package as claimed in claim 1, wherein a periphery of the dissipation layer is indented relatively to a periphery of the substrate; and a protective film is formed on the surface of the dissipation layer.

7. The semiconductor package as claimed in claim 6, wherein a solder mask layer is formed on the upper RDL, and parts of the upper RDL exposed from the solder mask layer function as connecting pads of the semiconductor package; and a metal heat dissipation plate is attached to the solder mask layer.

8. The semiconductor package as claimed in claim 6, wherein the insulated adhesive further comprises a supporting layer made of insulative fibers.

9. The semiconductor package as claimed in claim 1, wherein a solder mask layer is formed on the upper RDL, and parts of the upper RDL exposed from the solder mask layer function as connecting pads of the semiconductor package; and a metal heat dissipation plate is attached to the solder mask layer.

10. The semiconductor package as claimed in claim 1, wherein a first die and a second die are embedded in different positions of the substrate; and the dissipation layer extends to a first position corresponding to the first die, without extending to a second position corresponding to the second die.

11. The semiconductor package as claimed in claim 1, wherein the insulated adhesive further comprises a supporting layer made of insulative fibers.

* * * * *